US008884714B2

(12) United States Patent
Carey et al.

(10) Patent No.: US 8,884,714 B2
(45) Date of Patent: Nov. 11, 2014

(54) APPARATUS, SYSTEM, AND METHOD FOR DIGITAL BASE MODULATION OF POWER AMPLIFIER IN POLAR TRANSMITTER

(75) Inventors: Eoin Carey, Cork (IE); Pierce Joseph Nagle, Cork (IE)

(73) Assignee: Pine Valley Investments, Inc., Las Vegas, NV (US)

( * ) Notice: Subject to any disclaimer, the term of this patent is extended or adjusted under 35 U.S.C. 154(b) by 156 days.

(21) Appl. No.: 11/315,090

(22) Filed: Dec. 22, 2005

(65) Prior Publication Data

US 2007/0146090 A1 Jun. 28, 2007

(51) Int. Cl.
*H03C 3/38* (2006.01)
*H03C 5/00* (2006.01)

(52) U.S. Cl.
CPC ......................................... *H03C 5/00* (2013.01)
USPC ............ 332/145; 332/152; 330/149; 330/297

(58) Field of Classification Search
USPC .............. 332/145, 152; 330/149, 297; 455/73
See application file for complete search history.

(56) References Cited

U.S. PATENT DOCUMENTS

| 4,001,711 | A | * | 1/1977 | Knutson et al. ................. 330/66 |
|---|---|---|---|---|
| 4,630,315 | A | | 12/1986 | Watkinson |
| 5,524,286 | A | | 6/1996 | Chiesa et al. |
| 5,598,436 | A | | 1/1997 | Brajal et al. |
| 5,742,201 | A | | 4/1998 | Eisenberg et al. |
| 6,043,707 | A | | 3/2000 | Budnik |
| 6,101,224 | A | | 8/2000 | Lindoff et al. |
| 6,147,553 | A | | 11/2000 | Kolanek |
| 6,353,359 | B1 | | 3/2002 | Leizerovich |
| 6,445,249 | B1 | | 9/2002 | Khan et al. |
| 6,449,465 | B1 | | 9/2002 | Gailus et al. |
| 6,628,165 | B1 | | 9/2003 | Henderson et al. |
| 6,636,112 | B1 | | 10/2003 | McCune |
| 6,693,956 | B1 | | 2/2004 | Yamamoto |
| 6,701,134 | B1 | | 3/2004 | Epperson |
| 6,831,517 | B1 | * | 12/2004 | Hedberg et al. ................ 330/285 |
| 6,834,084 | B2 | | 12/2004 | Hietala |
| 6,844,788 | B2 | | 1/2005 | Chadwick |
| 6,873,211 | B1 | | 3/2005 | Thompson et al. |
| 7,221,915 | B2 | * | 5/2007 | Tripp et al. ................ 455/127.3 |
| 2002/0090921 | A1 | | 7/2002 | Midtgaard et al. |
| 2002/0193085 | A1 | | 12/2002 | Mathe et al. |
| 2002/0196864 | A1 | | 12/2002 | Booth et al. |
| 2003/0073419 | A1 | | 4/2003 | Chadwick |

(Continued)

FOREIGN PATENT DOCUMENTS

WO  WO 00/35080  6/2000
WO  WO 2004/036737  4/2004

OTHER PUBLICATIONS

Joel L. Dawson and Thomas H. Lee, "Automatic Phase Alignment for a Fully Integrated Cartesian Feedback Power Amplifier System," IEEE Journal of Solid-State Circuits, Dec. 2003, pp. 2269-2279, vol. 38, No. 12, IEEE, USA.

*Primary Examiner* — Arnold Kinkead
(74) *Attorney, Agent, or Firm* — Allen, Dyer, Doppelt, Milbrath & Gilchrist, P.A.

(57) ABSTRACT

An amplifier receives an amplitude signal of a polar modulated signal at a base terminal of a transistor and receives a phase modulated carrier signal of the polar modulated signal at the base terminal of the transistor. The amplifier combines the amplitude signal and the phase modulated signal to produce a full complex waveform at a collector terminal of the transistor.

16 Claims, 9 Drawing Sheets

(56) References Cited

U.S. PATENT DOCUMENTS

| | | |
|---|---|---|
| 2003/0184374 A1 | 10/2003 | Huang et al. |
| 2003/0215025 A1 | 11/2003 | Hietala |
| 2003/0215026 A1 | 11/2003 | Hietala |
| 2004/0021517 A1 | 2/2004 | Irvine et al. |
| 2004/0080364 A1 | 4/2004 | Sander et al. |
| 2004/0192369 A1 | 9/2004 | Nilsson |
| 2004/0198257 A1 | 10/2004 | Takano et al. |
| 2004/0198270 A1 | 10/2004 | Rozenblit et al. |
| 2004/0208157 A1 | 10/2004 | Sander et al. |
| 2004/0212445 A1 | 10/2004 | Haglan |
| 2004/0219891 A1 | 11/2004 | Hadjichristos |
| 2004/0247040 A1 | 12/2004 | Dennis et al. |
| 2004/0263245 A1 | 12/2004 | Winter et al. |
| 2004/0264583 A1 | 12/2004 | Ahmed |
| 2004/0266359 A1* | 12/2004 | Ahmed ..................... 455/67.14 |
| 2005/0017801 A1 | 1/2005 | Bachman, II et al. |
| 2005/0018790 A1* | 1/2005 | Liu ............................... 375/316 |
| 2005/0030104 A1 | 2/2005 | Chen et al. |
| 2005/0058219 A1 | 3/2005 | Liu |
| 2005/0064830 A1 | 3/2005 | Grigore |
| 2005/0110565 A1 | 5/2005 | Robinson |
| 2005/0110568 A1 | 5/2005 | Robinson et al. |
| 2005/0118965 A1 | 6/2005 | Tanabe et al. |
| 2005/0122164 A1 | 6/2005 | Brandt et al. |
| 2005/0123063 A1* | 6/2005 | Liu ............................... 375/295 |
| 2005/0134396 A1 | 6/2005 | Pehlke et al. |
| 2005/0190854 A1 | 9/2005 | Shakeshaft et al. |
| 2005/0191976 A1 | 9/2005 | Shakeshaft et al. |
| 2007/0014382 A1* | 1/2007 | Shakeshaft et al. ........... 375/297 |
| 2008/0233899 A1* | 9/2008 | Kanazawa ..................... 455/108 |

* cited by examiner

US 8,884,714 B2

APPARATUS, SYSTEM, AND METHOD FOR DIGITAL BASE MODULATION OF POWER AMPLIFIER IN POLAR TRANSMITTER

BACKGROUND

There are many benefits to using polar modulation as a means of transmitting information. Polar modulation makes possible the application of the amplitude modulation data signal at the very last stage of a transmitter before an antenna. As a result, all previous amplification stages may be operated in a constant envelope mode and can thus be biased very efficiently. Polar modulation also makes it possible to reduce the current drain quickly as the transmit power is reduced. Polar modulation provides clear talk-time benefits for wireless handset applications.

A common technique used to amplitude modulate a power amplifier includes modulating the power amplifier supply voltage. In the context of a power amplifier based on Gallium Arsenide (GaAs) heterojunction bipolar transistor (HBT) technology, amplitude modulation may be achieved by modulating the collector voltage applied to a HBT device (e.g., transistor) at the output stage of the power amplifier. Typically, the collector voltage may be modulated by introducing a metal oxide semiconductor (MOS) device in series with the power supply (e.g., the battery), which delivers the required current at a controlled voltage to the collector of the HBT device. The voltage drop across the MOS device, however, degrades the optimum efficiency that can be achieved relative to the situation with no MOS device. An additional drawback of the MOS device approach is that the modulation bandwidth that can be supported is limited by the both the capacitive loading associated with the large MOS device, and also by the closed-loop that is typically required to overcome the non-linear characteristic of the MOS device. Accordingly, there is a need for an alternate technique for amplitude modulation.

SUMMARY

In one embodiment, an apparatus comprises an amplifier to receive an amplitude signal of a polar modulated signal at a base terminal of a transistor. The amplifier receives a phase modulated carrier signal of the polar modulated signal at the base terminal of the transistor. The amplifier combines the amplitude signal and the phase modulated signal to produce a full complex waveform at a collector terminal of the transistor.

In one embodiment, an apparatus comprises a first amplifier to receive a first amplitude signal of a polar modulated signal at a base terminal of a first transistor, to receive a first phase modulated carrier signal of the polar modulated signal at the base terminal of the first transistor, and to combine the first amplitude signal and the first phase modulated signal to produce a first full complex waveform at a collector terminal of the first transistor.

In one embodiment, a system comprises a first antenna and a first amplifier coupled to the first antenna. The first amplifier to receive a first amplitude signal of a polar modulated signal at a base terminal of a first transistor, to receive a first phase modulated carrier signal of the polar modulated signal at the base terminal of the first transistor, and to combine the first amplitude signal and the first phase modulated signal to produce a first full complex waveform at a collector terminal of the first transistor.

DETAILED DESCRIPTION

In one embodiment, a technique to amplitude modulate a polar transmitter comprises modulating a transistor at the output stage of a power amplifier via a base terminal of the transistor rather than a collector terminal. In one embodiment, the amplifier transistor may be formed of GaAs HBT technology, for example. In a base modulation control technique, an MOS device may be provided in series with a base terminal of the output transistor rather than the collector terminal. Therefore, the voltage drop across the MOS device is eliminated and the efficiency performance of the transmitter may be improved. Furthermore, the intrinsic baseband to radio frequency (RF) transfer characteristics associated base modulation may exhibit linearity characteristics that may be processed using any suitable pre-distortion or correction technique. The embodiments are not limited in this context.

In one embodiment, digital polar modulation techniques may comprise a high degree of digital content relative to analog polar modulation techniques. For example, a digital amplitude modulator may be implemented as a digital segmented power amplifier. Embodiments of digital segmented power amplifiers (also known as a radio frequency digital-to-analog converters or RFDACs) are discussed in commonly owned and commonly assigned United States Patent Application Publication Numbers US 2004/0247040, and US 2004/0247047, which are incorporated herein by reference. A digital segmented power amplifier may be controlled such that the digital envelope may be corrected in conjunction with digital phase correction techniques associated with a digital phase modulator. Embodiments of such digital envelope correction techniques are discussed in commonly owned and commonly assigned United States Patent Application Publication Number US 2004/0183635, which is incorporated herein by reference.

In one embodiment, digital processing techniques discussed herein may be combined with any suitable analog and/or digital circuits to obtain modulation across multiple modulation techniques. These modulation techniques may include, for example, Gaussian Mean Shift Keying (GMSK) used in GSM, Gaussian Frequency Shift Keying (GFSK) used in Digital European Cordless Telecommunications (DECT) and Bluetooth, Phase Shift Keying with eight states allowing for coding using 8-bit combinations (8-PSK) used in EDGE, Offset Quadrature Phase Shift Keying (OQPSK) and Hybrid Phase-Shift Keying (HPSK) used in IS-2000, π/4 Differential Quadrature Phase-Shift Keying (DQPSK) used in Time Division Multiple Access (TDMA) and Orthogonal Frequency Division Modulation (OFDM) used in 802.11 and the like, among others. The embodiments are not limited in this context.

Figure 1:
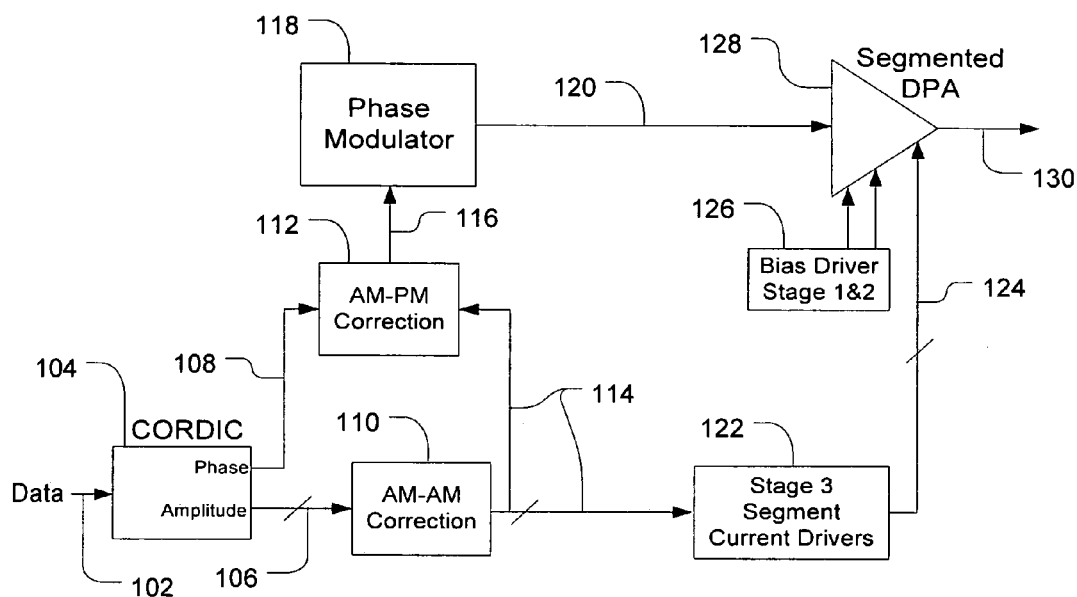
FIG. 1 illustrates one embodiment of a polar modulated transmitter comprising a digital segmented power amplifier.

FIG. 1 illustrates one embodiment of a polar modulated transmitter 100 comprising a digital segmented power amplifier 128. Polar modulated transmitter 100 comprises digital correction and processing modules. These modules may be configured to render the various embodiments discussed herein suitable for complementary metal oxide semiconductor (CMOS) technology scaling. The digital correction and processing modules may be configured to convert input binary data into vector modulation of an RF carrier. In various embodiments, the vectors may be represented either in rectangular coordinate form in terms of an in-phase (I) component and a quadrature component (Q) or may be represented in polar form in terms of magnitude (R) and phase angle (θ). The I and Q components may be converted to polar components R and θ using any suitable technique including, but not limited to, a CORDIC algorithm. The polar amplitude R and phase θ components may be pre-distorted in a piecewise linear manner to compensate for non-linearity or distortion introduced into output signal 130 by power amplifier 128. The relative timing of the R and θ paths also may be individually adjusted to compensate for delays introduced by the various circuit elements. The input data also may be processed by pulse shaping filters. The embodiments, however, are not limited in this context.

Data 102 is received at polar processing module 104. In one embodiment, data 102 may comprise rectangular signal coordinates (e.g., I, Q) to be received and converted to polar signal coordinates (e.g., R, θ) by polar processing module 104. In one embodiment, polar processing module 104 may be implemented using any suitable conversion techniques, including a CORDIC algorithm. In one embodiment, polar processing module 104 converts input data 102 from rectangular coordinates (I, Q) to polar coordinates (R, θ) and produces output signals comprising an amplitude component 106 (e.g., R) and a phase component 108 (e.g., θ). Amplitude component 106 and phase component 108 may be processed in separate paths. The embodiments are not limited in this context.

Amplitude component 106 may be provided to amplitude correction module 110. Amplitude component 106 may be provided in digital form comprising 2-N bits, where N represents any suitable number of bits to represent amplitude component 106 with adequate resolution and linearity. A higher number of bits produces a higher resolution amplitude component 106. In one embodiment, amplitude correction module 110 may be implemented as a distortion correction or modification module to correct amplitude non-linearity as a function of input amplitude (AM-AM) introduced into output signal 130 by power amplifier 128. AM-AM amplitude correction module 110 may be configured as a pre-distortion module to correct for non-linearity and distortion introduced by power amplifier 128 and timing correction for circuit timing delays. The AM-AM pre-distortion amplitude correction module 110 digitally pre-distorts the input amplitude using the input amplitude as the independent variable. The embodiments are not limited in this context.

Phase component 108 may be provided to phase correction module 112. Output signal 114 of amplitude correction module 110 also may be provided to phase correction module 112 to correct phase component 108 for any distortion caused by amplitude modulation. In one embodiment, phase correction module 112 may be implemented as a distortion correction or modification module to correct for phase shift as a function of input amplitude (AM-PM) introduced into output signal 130 by power amplifier 128. AM-PM distortion correction module 112 may be configured as a pre-distortion module to correct for non-linearity and distortion introduced by power amplifier 128 and timing corrections for circuit timing delays. The AM-PM pre-distortion phase correction module 112 digitally pre-distorts the input phase using the input phase as the independent variable. Phase output signal 116 from phase correction module 112 is provided to phase modulator 118. Phase modulated carrier signal 120 of phase modulator 118 is a phase modulated carrier and is provided to a phase input port of power amplifier 128. The embodiments are not limited in this context.

In one embodiment, power amplifier 128 may comprise 1–M amplification stages, where M is any suitable number of amplification stages. In one embodiment, power amplifier 128 may comprise three stages of amplification. Bias driver 126 biases the first and second stages. Output signal 114 of amplitude correction module 110 is provided to segment current driver 122. Segment current driver 122 drives the third stage of power amplifier 128 with amplitude modulation signal 124 to control the digital envelope of each of the amplitude segments. The third amplification stage may comprise, for example, a HBT device. Amplitude modulation signal 124 may be applied to a base terminal of the HBT device in any suitable manner to implement one embodiment of base modulation techniques previously described. For example, modulation signal 124 may be applied to a transistor in series with the power supply and the base terminal of the HBT device. Power amplifier 128 combines phase modulated carrier signal 120 and amplitude modulation signal 124 to construct a full complex waveform output signal 130 at an output terminal thereof. The embodiments are not limited in this context.

Figure 2:
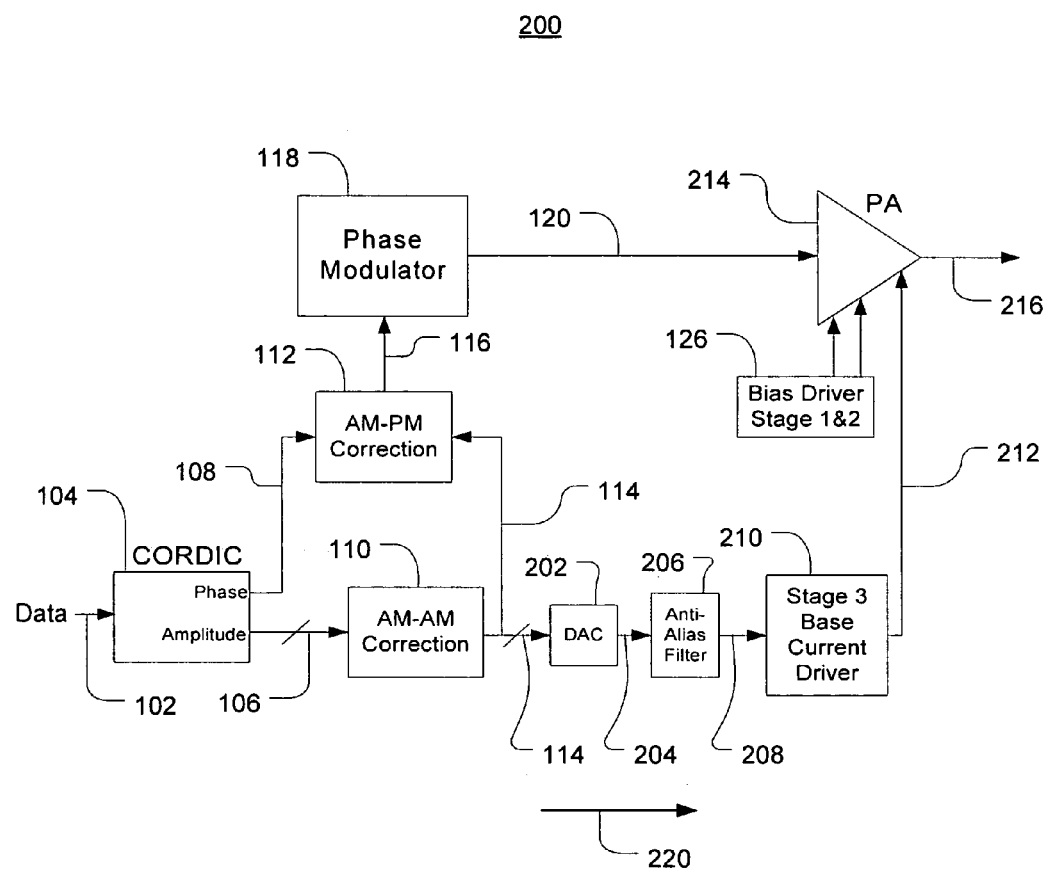
FIG. 2 illustrates one embodiment of a polar modulated transmitter comprising a power amplifier controlled using a suitable digital base modulation technique.

FIG. 2 illustrates one embodiment of a polar modulated transmitter 200 comprising a power amplifier 214 controlled using a suitable digital base modulation technique. Polar modulated transmitter 200 comprises similar digital correction and processing modules as described above with respect to FIG. 1. For example, data 102 is received and converted by polar processing module 104. Amplitude component 106 is processed by AM-AM correction module 110 and phase component 108 is processed by AM-PM correction module 112 along with amplitude component 114. Phase output signal 116 is provided to phase modulator 118. Phase modulated carrier signal 120 is provided to a phase input port of power amplifier 214. The digital base modulation implementation for power amplifier 214 is similar to that discussed above with respect to digital segmented power amplifier 128. One difference, however, is that at the final correction stage of AM-AM correction module 110, the digital segment controls of amplitude component 114 that otherwise would be applied to a digital segmented power amplifier, instead are applied to a baseband digital-to-analog converter 202 (DAC). Analog signal 204 representative of amplitude component 114 is provided to anti-alias filter 206 (AAF). AAF 206 smooths out analog signal 204 output of DAC 202 to compensate for the non-linearity of the base modulation stage (e.g., third stage) of power amplifier 214. Filtered signal 208 is provided to base current driver 210. In various embodiments, output signal 204 or filtered signal 208 may be coupled to a base terminal of a single HBT device at an output stage of power amplifier 214 to implement base modulation techniques in a polar modulation environment. The embodiments are not limited in this context.

In one embodiment, power amplifier 214 may comprise 1–M amplification stages, where M is any suitable number of amplification stages. In one embodiment, power amplifier 214 may comprise three stages of amplification. Bias driver 126 biases the first and second stages. Current driver 210 drives the third stage of power amplifier 214 with amplitude modulation signal 212 to control the digital envelope of the amplitude signal. The third amplification stage may comprise, for example, a HBT device. Amplitude modulation signal 212 may be applied to a base terminal of the HBT device in any suitable manner to implement one embodiment of base modulation techniques previously described. Power amplifier 214 combines phase modulated carrier signal 120 and amplitude modulation signal 212 to construct a full complex waveform output signal 216 at an output terminal thereof. The embodiments are not limited in this context.

Polar modulated transmitter 200 comprising power amplifier 214 may be controlled using any suitable digital base modulation technique to implement various wireless standards. For example, polar modulated transmitter 200 may be suitable in high linearity implementations. Accordingly, in one embodiment, a segmented stage of power amplifier 214 may no longer be segmented, but rather may comprise a single large HBT device, for example. The HBT device may be driven by a single control line with amplitude modulation signal 212. In base modulation implementations, amplitude modulation signal 212 may be coupled to a base terminal of a single HBT device at an output stage of power amplifier 214.

Controlling power amplifier 214 by driving HBT device over a single control line with amplitude modulation signal 212 enables several implementations of transmitter 200. These implementations may comprise, for example, an output signal 216 envelope resolution that is not limited in by the physical number of segments in power amplifier 214. Rather, the resolution may be defined by the bit-widths designated in digital correction module 110, for example. In addition, there are no small time-domain transient effects in output signal 216 waveform due to segment switching effects. This provides increased linearity and noise performance. Furthermore, reducing the number of segment control lines to a single control line simplifies the baseband filtering associated with a digital segmented power amplifier, for example. The embodiments, however, are not limited in this context.

The application of amplitude modulation signal 124, 212 to the base terminal of a HBT device in both digital segmented power amplifier 128 and power amplifier 214 supports a wide modulation bandwidth. In one embodiment, these implementations may support modulation bandwidths of several hundred MHz. Accordingly, the embodiments of transmitters 100, 200 discussed above may be suitable for wideband applications such as WCDMA, for example. In other embodiments, extremely wide modulation bandwidth capability makes these control approaches suitable for multi-mode implementations of transmitters 100, 200, for example. The embodiments, however, are not limited in this context.

It will appreciated that base modulation signals applied to the output stages of amplifiers 128, 214 of respective polar architecture based transmitters 100, 200 are not limited to digitally processed waveforms and associated baseband DAC 202 output signals along the envelope or amplitude control path 220. Rather, the scope of the embodiments described herein is intended to cover the applications of analog control waveforms to a base terminal of the output stage of amplifiers 128, 214. For example, embodiments described herein cover the application of an analog waveform to a base terminal of an HBT device in the output stage of amplifiers 128, 214 to implement the base modulation technique described herein.

Figure 3:
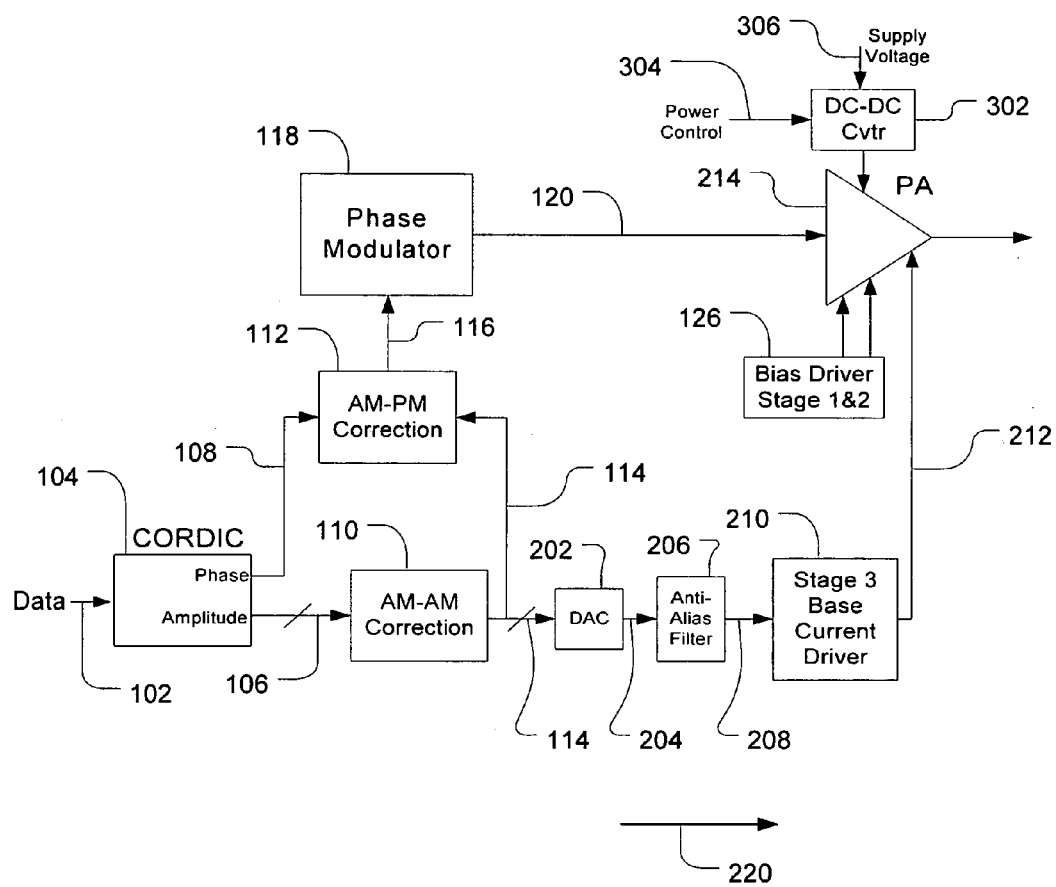
FIG. 3 illustrates one embodiment of a polar modulated transmitter comprising power amplifier controlled using a suitable digital base modulation technique.

FIG. 3 illustrates one embodiment of a polar modulated transmitter 300 comprising power amplifier 214 controlled using any suitable digital base modulation technique. The architecture of polar modulated transmitter 300 is substantially similar to the architecture of polar modulated transmitter 200 with the exception that the collector power supply terminal of a transistor in the output stage of power amplifier 214 is controlled by power converter 302. In one embodiment, power converter 302 may be a DC-DC converter. Power converter 302 may be selected via power control input signal 304. Power converter 302 is coupled to a power supply voltage 306.

In general, use of power converter 302 on the collector supply terminal of a conventional power amplifier enables the collector voltage to be adjusted as a function of output power of amplifier 214. The efficiency of power amplifier 214 may be optimized when the power amplifier 214 is backed off from its maximum-rated power provided that power converter 302 is efficient. This efficiency enhancement technique also may be compatible with digital base amplitude modulation techniques used to control power amplifier 214. Accordingly, the combination of base modulation and collector power supply control further optimizes the efficiency of power amplifier 214 under backed off conditions.

Figure 4:
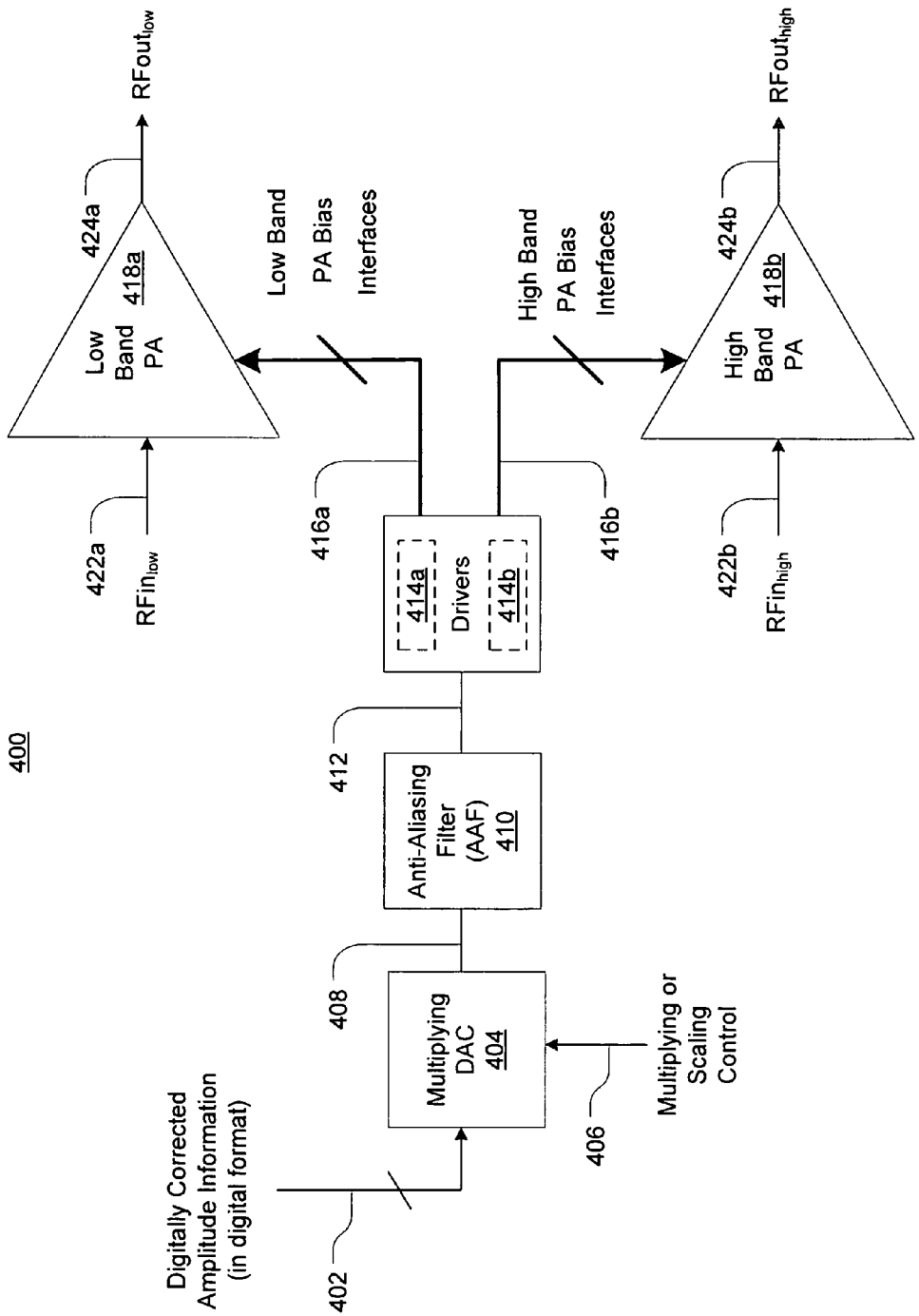
FIG. 4 illustrates one embodiment of a polar transmitter.

FIG. 4 illustrates one embodiment of a polar transmitter 400. Polar transmitter 400 comprises multiplying DAC 404. Digitally corrected amplitude information 402 is applied to input ports of multiplying DAC 404. Digitally corrected amplitude information 402 may comprise 2–M bits, where M represents any suitable number of bits to resolve the amplitude information with a suitable resolution and linearity. Digitally corrected amplitude information 402 may be received from an output port of AM-AM correction module, such as, for example, amplitude correction module 110. In one embodiment, multiplying or scaling control signal 406 may be provided to an input port of multiplying DAC 404.

In one embodiment, analog output signal 408 may be applied to anti-aliasing filter 410 (AAF). Filtered analog amplitude signal 412 is applied to drivers 414a, 414b. Either driver 414a, b may be selected based on a particular mode (e.g., high band mode or low band mode) of operation of transmitter 400. Depending on the particular implementation, drivers 414a, b each may comprise multiple voltage mode or current mode drivers to drive respective digital power amplifiers 418a, b. The number may be proportional to the number of amplification stages of power amplifiers 418a, b. For example, power amplifiers 418a, b may include P amplification stages biased by P drivers, where P is any number. At least one of the amplification stages may include a transistor device (e.g., HBT device) to receive a modulated signal at a base terminal thereof. Accordingly, at least one of the drivers 414a, b may be configured to provide the modulation signal to the base terminal of the output transistor device.

In one embodiment, drivers 414a, b may be configured to operate in two or more different modes. For example, in GSM EDGE implementations, drivers 414a, b may be configured to drive both low band and high band digital power amplifiers. Accordingly, driver 414a may drive low band power amplifier 418a bias output signals 416a to provide suitable biasing for each amplification stage of low band power amplifier 418a. In addition, any one of bias output signals 416a may include an amplitude modulation signal, e.g., amplitude modulation signal 212, to control the digital envelope to be amplified by power amplifier 418a. Driver 414b may drive high band power amplifier 418b bias output signals 416b to provide suitable biasing for each amplification stage of power amplifier 418b. In addition, any one of bias output signals 416b may include an amplitude modulation signal, e.g., amplitude modulation signal 212, to control the digital envelope to be amplified by power amplifier 418b. The amplitude modulation signal may be applied to output amplification stages of power amplifiers 418a, b. In one embodiment, the amplitude modulation signal may be applied to a base terminal of a HBT device in any suitable manner to implement one embodiment of the base modulation techniques previously described.

In one embodiment, low band RF input signal 422a RFin$_{low}$ may be applied to an input port of low band digital power amplifier 418a. RF input signal 422a RFin$_{low}$ comprises an RF carrier containing phase modulation information. High band RF input signal 422b RFin$_{high}$ may be applied to an input port of high band digital power amplifier 418b. RF input signal 422b also may comprise an RF carrier containing phase modulation information. For example, signal 120 as discussed with respect to FIGS. 1-3. Each digital power amplifier 418a, b produces respective amplified RF output signals 424a, 424b. RF output signals 424a, b include RF carrier, signal amplitude, and phase information. Digital power amplifiers 418a, b are base modulated in at least one amplification stage to produce output signals 424a, b.

Figure 5:
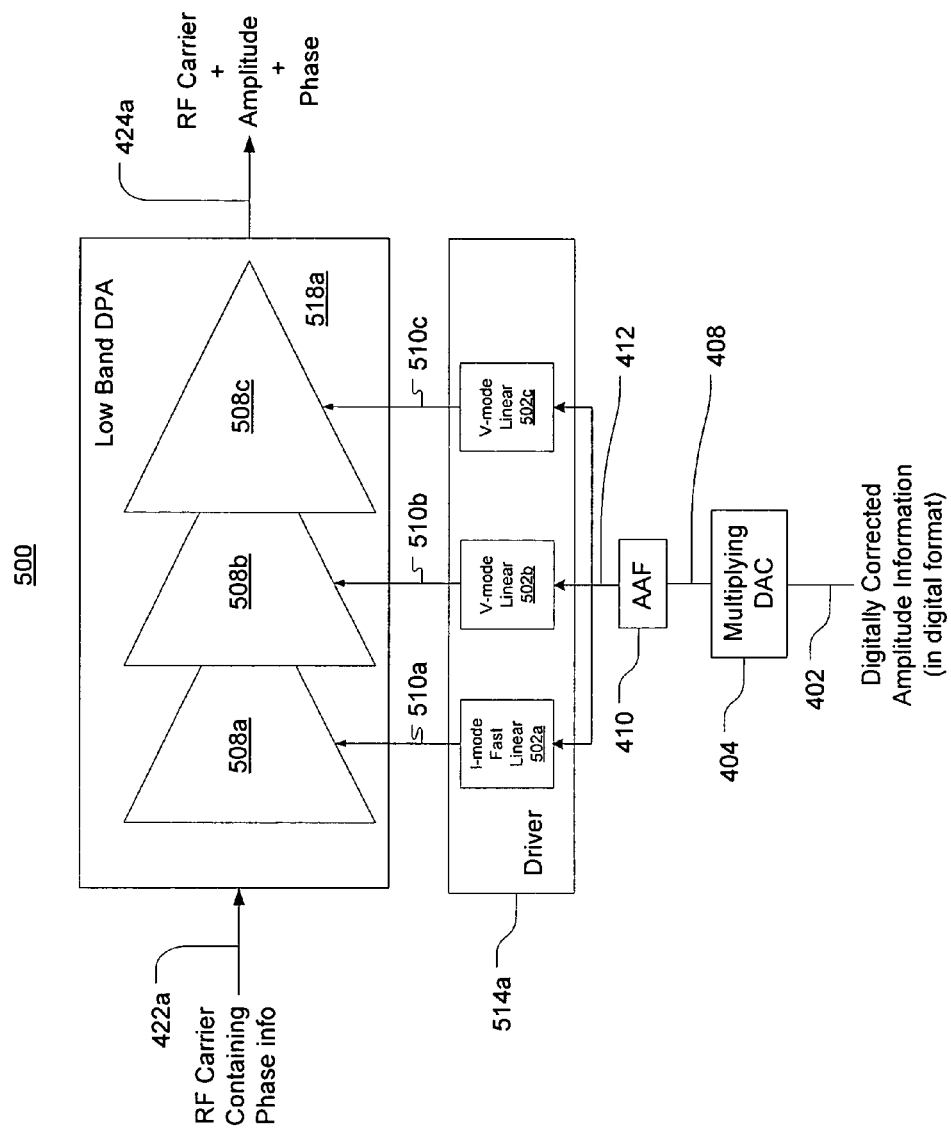
FIG. 5 illustrates one embodiment of a polar modulated transmitter comprising one embodiment of power amplifier and driver circuit to provide bias currents and voltages to power amplifier.

FIG. 5 illustrates one embodiment of a polar modulated transmitter 500 comprising one embodiment of power amplifier 518a including driver circuit 514a to drive bias currents and voltages to power amplifier 518a. Polar modulated transmitter 500 is a portion of a multi-mode transmitter where only the low band digital power amplifier portion is shown. Accordingly, in one embodiment of multi-mode polar modulated transmitter 500, power amplifier 518a may be a low band digital power amplifier. Power amplifier 518a may be a RF DAC adapted for telecommunications implementations. For example, in one embodiment, power amplifier 518a may be adapted as a low band RF digital power amplifier for GSM EDGE implementations. In one embodiment, power amplifier 518a comprises three amplification stages including a first amplification stage 508a, a second amplification stage 508b, and a third amplification stage 508c. Low band RF input signal 422a RFin$_{low}$ comprising an RF carrier containing phase modulation information may be applied to an input port of first amplification stage 508a. RF output signal 424a may be applied to antenna or to other amplification stages or circuit elements.

In one embodiment, driver 514a comprises three bias modules 502a, 502b, 502c to drive respective bias currents or supply voltages 510a, 510b, 510c to bias respective amplification stages 508a, 508b, 508c. Digitally corrected amplitude information 402 may be received from an output port of AM-AM correction module, such as, for example, amplitude correction module 110. In one embodiment, multiplying DAC 404 also may receive multiplying or scaling control signal 406 at an input port of multiplying DAC 404. In one embodiment, analog output signal 408 may be applied to anti-aliasing filter 410 (AAF). As previously described, AAF 410 smooths out analog signal 408 output of multiplying DAC 404 to compensate for the non-linearity of third amplification stage 508c (e.g., the base modulation stage) of power amplifier 518a. Filtered analog amplitude signal 412 of AAF 410 forms the input to each bias module 502a-c. Bias modules 502a-c may be configured to operate either in current mode or voltage mode to drive bias current or supply voltage in linear or non-linear (e.g., square) proportions. For example, bias module 502a may be configured to operate in fast-linear current mode and bias modules 502b, c may be configured to operate in linear voltage mode. In addition, each bias module 502a-c may be configured to implement analog shaping functions. At least one of bias modules 502a-1 may be adapted to provide a modulation signal to a base terminal of a transistor in any one of amplification stages 508a-c to implement a base modulation technique in accordance with the various embodiments described herein. For example, in one embodiment, bias module 508c may be configured to modulate a power amplifier transistor via a base terminal of the transistor rather than a collector terminal. In one embodiment, the amplifier transistor may be formed of GaAs HBT technology, for example, and bias module 508c may be configured to provide modulation signal 510c to drive the base terminal of an HBT transistor in third amplification stage 508c (e.g., the output stage of power amplifier 518a).

Figure 6:
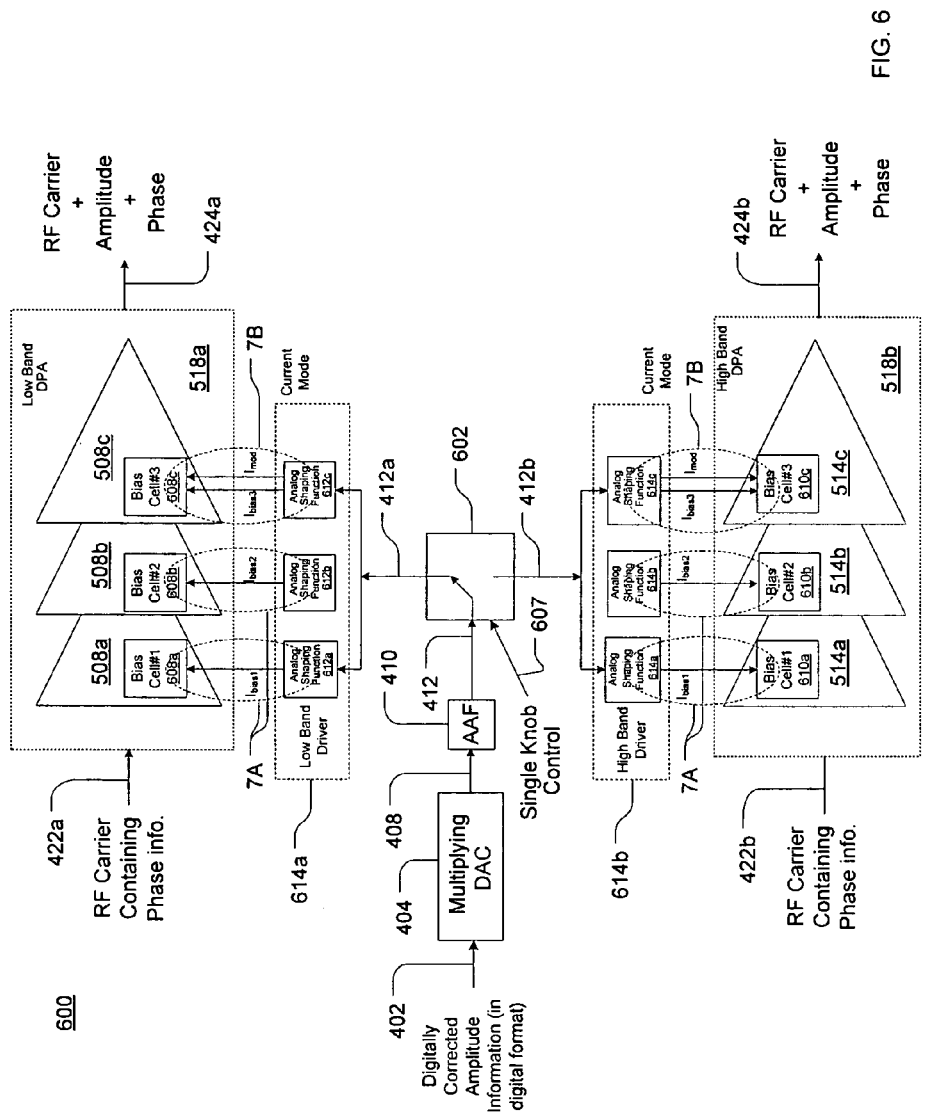
FIG. 6 illustrates one embodiment of a multi-mode polar transmitter.

FIG. 6 illustrates one embodiment of a multi-mode polar transmitter 600. Multi-mode polar transmitter 600 comprises multiplying DAC 404. Digitally corrected amplitude information 402 is applied to input ports of multiplying DAC 404. Digitally corrected amplitude information 402 may comprise 2–M bits, where M represents any suitable number of bits to resolve the amplitude information with a suitable resolution and linearity. In one embodiment, digitally corrected amplitude information 402 may be received from an output port of AM-AM correction module, such as, for example, amplitude correction module 110.

In one embodiment, analog output signal 408 may be applied to AAF 410. Filtered analog amplitude signal 412 may be applied to mode select switch 602. Mode select switch 602 may be controlled via single knob control signal 607. Mode select switch routes filtered analog amplitude signal 412 to either low band or high digital power amplifiers 518a or 518b, respectively. As previously discussed, in one embodiment, power amplifier 518a may be adapted as a low band RF digital power amplifier for GSM EDGE implementations. Likewise, in one embodiment, power amplifier 518b may be adapted as a high band RF digital power amplifier for GSM EDGE implementations. Accordingly, low band waveforms 412a are routed to low band digital power amplifier 518a and high band waveforms 412b are routed to high band digital power amplifier 518b thorough respective low band driver 614a and high band driver 614b based on the selection of single knob control signal 607. Either low band driver 614a or high band driver 614b may be selected based on the particular mode of operation of transmitter 600 (e.g., high band mode or low band mode). Low band digital power amplifier 518a receives input signal 422a, which comprises and RF carrier containing phase information. High band digital power amplifier 518b receives input signal 422b, which comprises and RF carrier containing phase information.

In one embodiment, low band driver 614a may comprise multiple current mode driver modules 612a, 612b, 612c to bias respective bias cells 608a, 608b, 608c of low band digital power amplifier 518a amplification stages 508a, 508b, 508c, respectively. In one embodiment, current mode driver modules 612a-c may be configured to shape the analog waveforms of analog input signal 412a. In one embodiment, current mode driver modules 612a-c supply bias current $I_{bias}$ to respective bias cells 608a-c. Current mode driver module 612a generates bias current $I_{bias1}$ to bias cell 608a of amplification stage 508a. Current mode driver module 612b generates bias current $I_{bias2}$ to bias cell 608b of amplification stage 508b. Current mode driver module 612c generates bias current $I_{bias3}$ to bias cell 608c of amplification stage 508c. In addition current mode driver module 612c also generates modulation current signal $I_{mod}$ to the output stage of bias cell 608c. $I_{mod}$ represents amplitude modulation signal based on digitally corrected amplitude information 402. $I_{mod}$ may be applied to the base terminal of an amplifier transistor (e.g., HBT device) in amplification stage 508c, for example. Detailed views of one embodiment of bias interfaces 7A and 7B are shown in FIGS. 7A and 7B.

In one embodiment, high band driver 614b may comprise multiple current mode driver modules 614a, 614b, 614c to bias respective bias cells 610a, 610b, 610c of high band power amplifier 518b amplification stages 514a, 514b, 514c, respectively. In operation high band driver 614a and power amplifier 518a, including amplification stages 514a-c and respective bias cells 610a, 610b, 610c operate in a manner similar to that described above with respect to low band digital power amplifier 518a.

Output signals 424a, b may be provided to an antenna for transmission or may be provided to other circuit elements. Each output signal 424a, b comprises RF carrier, amplitude, and phase information.

Figure 7:
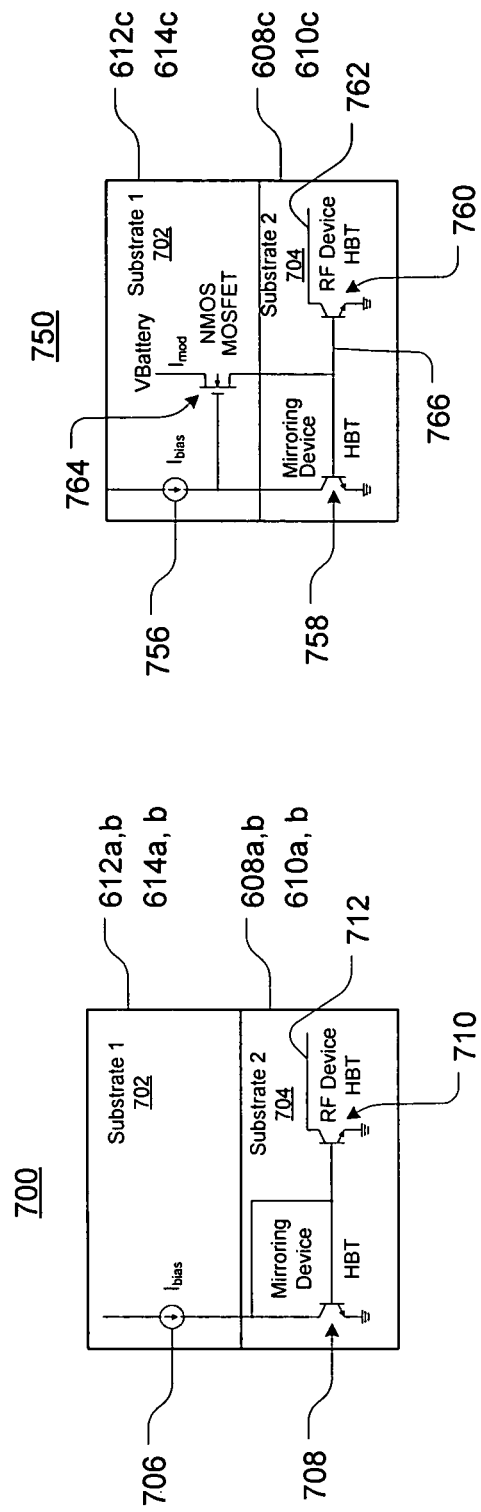
FIG. 7A illustrates one embodiment of a bias interface circuit for first and second amplification stages of respective power amplifiers.
FIG. 7B illustrates one embodiment of a bias interface circuit for third amplification stages of respective power amplifiers.

FIG. 7A illustrates one embodiment of a bias interface circuit for first and second amplification stages 508a, b and 514a, b of respective power amplifiers 518a, b. Bias interface circuit 700 represents one embodiment of current mode driver modules 612a, b, 614a, b and bias cells 608a, b, 610a, b. Bias interface circuit 700 may be configured to drive bias currents $I_{bias1}$ and $I_{bias2}$ between current mode driver modules 612a, 612b formed on first substrate 702 and bias cells 608a, 608b formed on second substrate 704. First substrate may be formed of Silicon (Si) and second substrate may be formed of Gallium Arsenide (GaAs), for example.

In one embodiment, bias interface circuit 700 comprises current source 706 to drive $I_{bias}$ from current mode driver modules 612a, b, 614a, b to respective bias cells 608a, b, 610a, b. In one embodiment, bias cells 608a, b, 610a, b comprise mirroring device 708 and RF device 710. Mirroring device 708 drives $I_{bias}$ in the output collector 712 terminal of RF device 710. Both mirroring device 708 and RF device 710 may be HBT devices.

FIG. 7B illustrates one embodiment of a bias interface circuit for third amplification stages 508c, 514c of respective power amplifiers 518a, b. Bias interface circuit 750 represents one embodiment of current mode driver modules 612c, 614c and bias cells 608c, 610c. Bias interface circuit 750 may be configured to drive bias current $I_{bias3}$ and modulation current $I_{mod}$ between current mode driver module 612c formed on first substrate 702 and bias cell 608c formed on second substrate 704. As previously discussed, first substrate may be formed of Si and second substrate may be formed of GaAs, for example.

In one embodiment, bias interface circuit 750 comprises current source 756 to drive $I_{bias3}$ from current mode driver module 612c to bias cell 608c. In one embodiment, bias cell 608c comprises mirroring device 758 and RF device 760. Mirroring device 758 drives $I_{bias3}$ in the output collector terminal 762 of RF device 760. Both mirroring device 758 and RF device 760 may be HBT devices. Modulation current $I_{mod}$ may be driven by transistor device 764 into base terminal 766 of RF device 760. In one embodiment, transistor device 764 may be an N-MOS MOSFET transistor device. Collector terminal 762 is coupled to outputs of respective power amplifiers 518a, b to generate respective amplified RF output signals 424a, 424b. As shown the base current of HBT device 760 may be modulated by introducing N-MOS MOSFET transistor device 764 in series with base terminal 766 of HBT device 760 and the power supply (e.g., battery), which delivers the required current at a controlled voltage into base terminal 766 of HBT device 760. In this configuration, there is no voltage drop in the collector terminal of HBT device 760. Therefore, there is no degradation of the optimum efficiency that can be achieved relative to the situation where a MOS device. Furthermore, the modulation bandwidth that can be supported is not limited by the capacitive loading associated with the large MOS device, and is not limited by the closed-loop that is typically required to overcome the non-linear characteristic of the MOS device.

Figure 8:
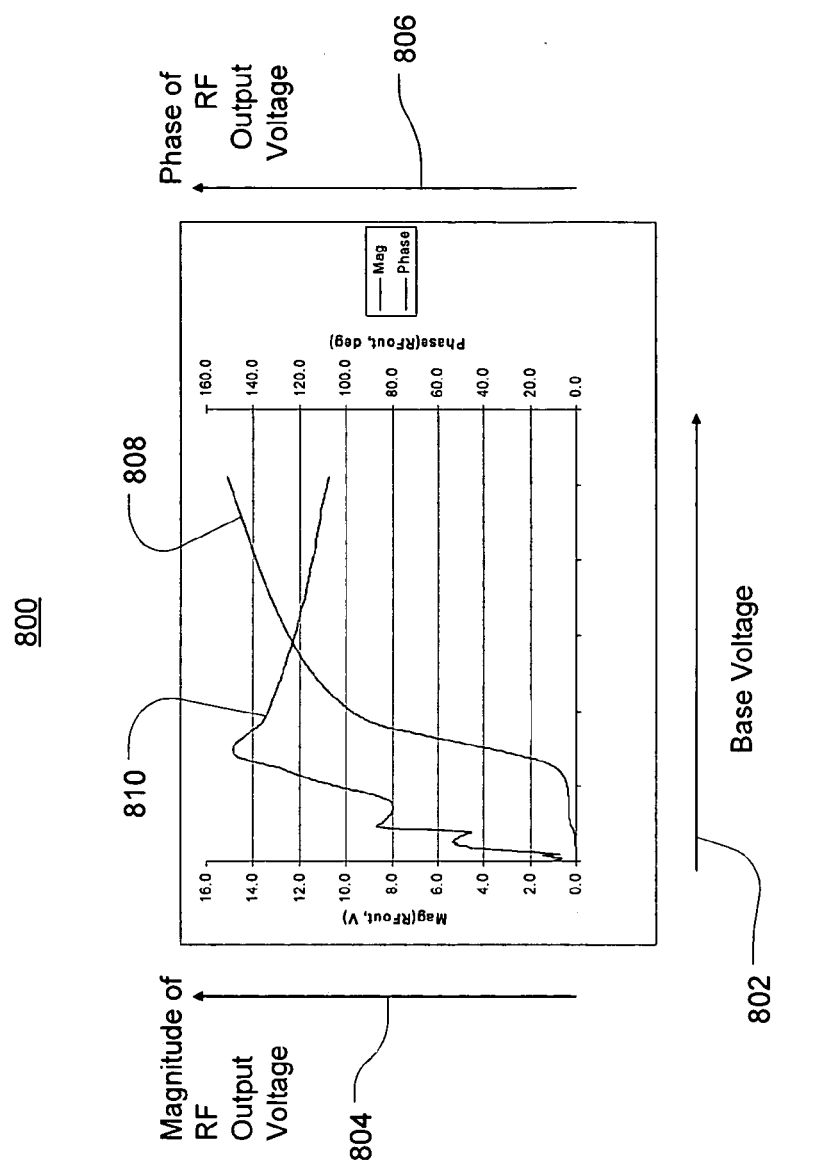
FIG. 8 illustrates a graph of a transfer characteristic of measured AM-AM and AM-PM at high power without digital correction.

FIG. 8 illustrates a graph 800 of a transfer characteristic of measured AM-AM and AM-PM at high power without digital correction. The characteristics are measured as function of base voltage applied to base 766 of transistor 760. Horizontal axis 802 represents base voltage. First vertical axis 804 represents the magnitude of RF output voltage in terms of voltage (e.g., 424a, b) as a function of base 766 voltage. Second vertical axis 806 represents the phase of RF output voltage in terms of degrees (e.g., 424a, b) as a function of base 766 voltage. Magnitude of RF output voltage waveform 808 and phase of RF output voltage waveform 810 are shown as a function of base 766 voltage.

Operations for the above system and subsystem may be further described with reference to the following figures and accompanying examples. Some of the figures may include programming logic. Although such figures presented herein may include a particular programming logic, it can be appreciated that the programming logic merely provides an example of how the general functionality described herein can be implemented. Further, the given programming logic does not necessarily have to be executed in the order presented unless otherwise indicated. In addition, the given programming logic may be implemented by a hardware element, a software element executed by a processor, or any combination thereof. The embodiments are not limited in this context.

Figure 9:
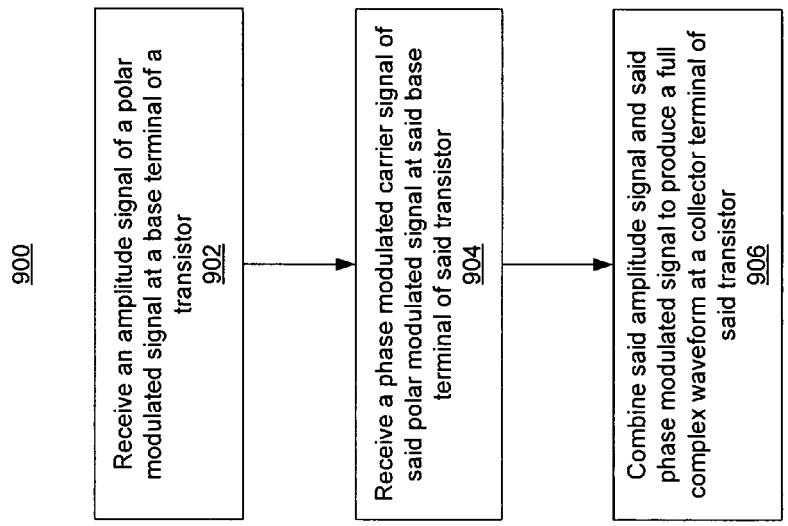
FIG. 9 illustrates one embodiment of a logic flow diagram.

FIG. 9 illustrates one embodiment of a logic flow diagram 900. Accordingly, a power amplifier 518a may be configured to receive (902) an amplitude signal 412a of a polar modulated signal 402 at a base terminal 766 of a transistor 760. Power amplifier 518a receives (904) a phase modulated carrier signal 422a of the polar modulated signal 402 at the base terminal 766 of the transistor 760. Power amplifier 518a combines (906) the amplitude signal 412a and the phase modulated signal 422a to produce a full complex waveform 424a at a collector terminal 762 of the transistor 760.

In one embodiment, the amplitude signal 412a may be pre-distorted by amplitude correction module 110 to compensate for non-linearity of transistor 760. Further, the phase modulated carrier signal 422a may be pre-distorted by phase correction module 112 to compensate for non-linearity of the transistor 760.

In one embodiment, digital segment control signals may be received at an input portion of a digital to analog converter and a polar modulated signal may be produced at an output portion of the digital to analog converter.

In one embodiment, a power supply signal may be received by transistor 764 and may be combined with the phase modulated carrier signal 422a and the amplitude signal 412a by transistor 760. The voltage at the collector terminal 762 of the transistor 760 may be adjusted under backed off conditions in accordance with output power of the transistor 760.

Numerous specific details have been set forth herein to provide a thorough understanding of the embodiments. It will be understood by those skilled in the art, however, that the embodiments may be practiced without these specific details. In other instances, well-known operations, components and circuits have not been described in detail so as not to obscure the embodiments. It can be appreciated that the specific structural and functional details disclosed herein may be representative and do not necessarily limit the scope of the embodiments.

It is also worthy to note that any reference to "one embodiment" or "an embodiment" means that a particular feature, structure, or characteristic described in connection with the embodiment is included in at least one embodiment. The appearances of the phrase "in one embodiment" in various places in the specification are not necessarily all referring to the same embodiment.

Some embodiments may be implemented using an architecture that may vary in accordance with any number of factors, such as desired speed, power levels, heat tolerances, semiconductor manufacturing processing, input rates, output rates, memory resources, and other performance constraints.

Some embodiments may be described using the expression "coupled" along with their derivatives. It should be understood that the term "coupled" may be used to indicate that two or more elements are in direct physical or electrical contact. The term "coupled," however, also may mean that two or more elements are not in direct contact with each other, but yet still co-operate or interact with each other. The embodiments are not limited in this context.

While certain features of the embodiments have been illustrated as described herein, many modifications, substitutions, changes and equivalents will now occur to those skilled in the art. It is therefore to be understood that the appended claims are intended to cover all such modifications and changes as fall within the true spirit of the embodiments.

The invention claimed is:

1. A multi-mode polar transmitter comprising:
a filter configured to receive a polar modulated signal and to provide an amplitude signal;
a first amplifier;
a second amplifier; and
a switch to be coupled to said filter and configured to selectively provide one of said first and second amplifiers the amplitude signal;
each amplifier including a bias interface circuit comprising
a first substrate comprising a first material and a second substrate comprising a second material different from the first material,
a first transistor on said first substrate and having a control terminal configured to receive a bias current, and a first conduction terminal configured to provide a power supply signal, and
a second transistor on said second substrate and having
a control terminal to be coupled to the first conduction terminal of said first transistor and being configured to receive the amplitude signal, a phase modulated carrier signal, and the power supply signal, and
a first conduction terminal configured to provide a combined waveform of the amplitude signal, the phase modulated carrier signal, and the power supply signal.

2. The multi-mode polar transmitter of claim 1 further comprising a correction circuit configured to pre-distort the amplitude signal for reducing non-linearity of said second transistor.

3. The multi-mode polar transmitter of claim 2 wherein said correction circuit is configured to pre-distort the phase modulated carrier signal for reducing non-linearity of said second transistor.

4. The multi-mode polar transmitter of claim 1 further comprising a digital-to-analog converter (DAC) having an output to be coupled to said filter and configured to receive the polar modulated signal and digital segment control data.

5. The multi-mode polar transmitter of claim 1 wherein a voltage on the first conduction terminal of said second transistor is changed based an output power of said second transistor.

6. The multi-mode polar transmitter of claim 1 wherein said first amplifier comprises a high band amplifier.

7. The multi-mode polar transmitter of claim 1 wherein said second amplifier comprises a low band amplifier.

8. A multi-mode polar transmitter comprising:
a filter configured to receive a polar modulated signal and to provide an amplitude signal;
a high band amplifier;
a low band amplifier;
a switch to be coupled to said filter and configured to selectively provide one of said high band and low band amplifiers the amplitude signal; and
a digital-to-analog converter (DAC) having an output to be coupled to said filter and configured to receive the polar modulated signal and digital segment control data;
each amplifier including a bias interface circuit comprising
a first substrate comprising a first material and a second substrate comprising a second material different from the first material,
a first transistor on said first substrate and having a control terminal configured to receive a bias current, and a first conduction terminal configured to provide a power supply signal, and
a second transistor on said second substrate and having
a control terminal to be coupled to the first conduction terminal of said first transistor and being configured to receive the amplitude signal, a phase modulated carrier signal, and the power supply signal, and
a first conduction terminal configured to provide a combined waveform of the amplitude signal, the phase modulated carrier signal, and the power supply signal.

9. The multi-mode polar transmitter of claim 8 further comprising a correction circuit configured to pre-distort the amplitude signal for reducing non-linearity of said second transistor.

10. The multi-mode polar transmitter of claim 9 wherein said correction circuit is configured to pre-distort the phase modulated carrier signal for reducing non-linearity of said second transistor.

11. The multi-mode polar transmitter of claim 8 wherein a voltage on the first conduction terminal of said second transistor is changed based an output power of said second transistor.

12. A method of operating a multi-mode polar transmitter receiving a polar modulated signal, the method comprising:
using a switch coupled to selectively provide one of first and second amplifiers an amplitude signal based upon the polar modulated signal;
receiving a bias current at a control terminal of a first transistor in a bias interface circuit of each amplifier, the first transistor being on a first substrate comprising a first material;
providing a power supply signal at a first conduction terminal of the first transistor;
receiving the amplitude signal, a phase modulated carrier signal, and the power supply signal at a control terminal of a second transistor, the control terminal of the second transistor being coupled to the first conduction terminal of the first transistor, the second transistor being on a second substrate comprising a second material different from the first material;

providing a combined waveform of the amplitude signal, the phase modulated carrier signal, and the power supply signal at a first conduction terminal of the second transistor; and transmitting the combined waveform.

13. The method of claim 12 further comprising pre-distorting the amplitude signal for reducing non-linearity of the second transistor.

14. The method of claim 12 further comprising receiving with a digital-to-analog converter (DAC) the polar modulated signal and digital segment control data.

15. The method of claim 12 further comprising pre-distorting the phase modulated carrier signal for reducing non-linearity of the second transistor.

16. The method of claim 12 further comprising changing a voltage on the first conduction terminal of the second transistor based an output power of the second transistor.

* * * * *